United States Patent [19]
Link et al.

[11] Patent Number: 5,796,308
[45] Date of Patent: Aug. 18, 1998

[54] DIFFERENTIAL ATTENUATOR COMMON MODE REJECTION CORRECTION CIRCUIT

[75] Inventors: Garry N. Link, Aloha; Roland E. Andrews, Portland, both of Oreg.

[73] Assignee: Tektronix, Inc., Wilsonville, Oreg.

[21] Appl. No.: 672,818

[22] Filed: Jun. 28, 1996

[51] Int. Cl.$^6$ .................................................. H03G 3/30
[52] U.S. Cl. ........................ 330/284; 330/303; 330/305
[58] Field of Search ................................. 330/144, 145, 330/284, 303, 305; 324/126; 333/81 R

[56] References Cited

U.S. PATENT DOCUMENTS

| | | | |
|---|---|---|---|
| 3,343,099 | 9/1967 | Paul | 330/284 V |
| 3,702,405 | 11/1972 | Zwirn et al. | 307/109 |
| 4,122,398 | 10/1978 | Dunn | 330/303 X |
| 4,507,618 | 3/1985 | Nelson | 330/126 |

*Primary Examiner*—James B. Mullins
*Attorney, Agent, or Firm*—Boulden G. Griffith; Thomas F. Lenihan

[57] ABSTRACT

A differential attenuator is described that is capable of automatic calibration using electronically adjustable circuit elements. The differential attenuator has positive and negative inputs and outputs. A resistor and capacitor couple the positive side input and output, while a matching resistor and capacitor couple the negative side input and output. Shunt resistors and shunt capacitors coupled to the positive and negative outputs are augmented and made electronically adjustable by multipliers having their signal inputs coupled to the respective side output nodes. The outputs of one set of multipliers are coupled to the other ends of the shunt resistors, while their multiplication coefficients are controlled by a dc_control signal. The outputs of another set of multipliers are capacitively coupled back to their respective side output nodes, while their multiplication coefficients are controlled by an ac_control signal. Through the use of these controls a wide range of side-to-side component variations can be compensated to maximize the common mode rejection ratio achievable.

3 Claims, 2 Drawing Sheets

DIFFERENTIAL ATTENUATOR COMMON MODE REJECTION CORRECTION CIRCUIT

FIELD OF THE INVENTION

This invention relates to differential attenuators, and more particularly to circuitry for electronically correcting mismatches in component values that affect the multiplication coefficient matching of the two attenuator halves.

BACKGROUND OF THE INVENTION

A differential attenuator is commonly used to attenuate both the common mode signals and differential mode signals that are the input to any differential amplifier or the active circuitry of an active differential probe for an oscilloscope or other instrument. Typically, differential probes are used to reject the common mode signal and the differential signal, while minimizing any excess attenuation of the differential signal.

If any balanced pairs or precisely ratioed discrete components must be used as part of a differential attenuator, any mismatches of those parts will serve to convert a part of the common mode input into differential mode output of the attenuator. Since the desired common mode rejection ratio (CMRR) specifications require tolerances that are more exact than practical manufacturing methods allow, it is desirable to be able to provide an adjustment scheme to correct for any mismatches in these components.

Historically, manual methods have been employed to accomplish this nulling adjustment. FIG. 1 shows a differential attenuator circuit with adjustable discrete components that are suitable for performing a manual balancing procedure.

With this circuit, the low frequency CMRR can be adjusted using a three step process: First, RV1 is used to adjust the output between Vout-p and Vout-n to minimum while the inputs Vin-p and Vin-n are shorted together and driven with a slow test signal (e.g., 1/10 the break frequency of the R-C components).

Second, the positive input Vin-p is driven with a step function input and C2 is adjusted to achieve a flat stepped response (no overshoot or undershoot). Finally, the two inputs, Vin-p and Vin-n, are tied together and driven with a fast test signal (e.g., 10 times the break frequency of the R-C components) and C4 is adjusted to null the high frequency output signal.

This manual approach is labor intensive and relies on bulky adjustable components, both of which are serious disadvantages in many circumstances. Furthermore, mechanical or electrical stresses can interfere with the delicate balance that this approach achieves and therefore may necessitate recalibration. Such a recalibration may not be convenient, or, even worse, the need for recalibration may go unrecognized for some indeterminate amount of time, thereby casting doubt on all measurements made using the attenuator.

Therefore, there would be highly desirable to be able to provide a high speed differential active probe with a differential attenuator that is capable of automatic calibration using electronically adjustable circuit elements to provide resistance and capacitance.

SUMMARY OF THE INVENTION

Accordingly, the present invention provides a differential attenuator that is capable of automatic calibration using electronically adjustable circuit elements. A differential attenuator has positive and negative inputs and outputs. A resistor and capacitor couple the positive side input and output, while a matching resistor and capacitor couple the negative side input and output. Shunt resistors and shunt capacitors coupled to the positive and negative outputs are augmented and made electronically adjustable by multipliers having their signal inputs coupled to the respective side output nodes. The outputs of one set of multipliers are coupled to the other ends of the shunt resistors, while their multiplication coefficients are controlled by a decontrol signal. The outputs of another set of multipliers are capacitively coupled back to their respective side output nodes, while their multiplication coefficients are controlled by an ac_control signal.

It is an object of the present invention to eliminate manual adjustments and substitute electronically controllable circuitry.

It is another object of the present invention to reduce the space required by the circuitry to compensate for common mode rejection ratio errors.

It is another object of the present invention to reduce power consumption by the circuitry required to compensate for common mode rejection ratio errors.

DETAILED DESCRIPTION OF THE INVENTION

Figure 1:
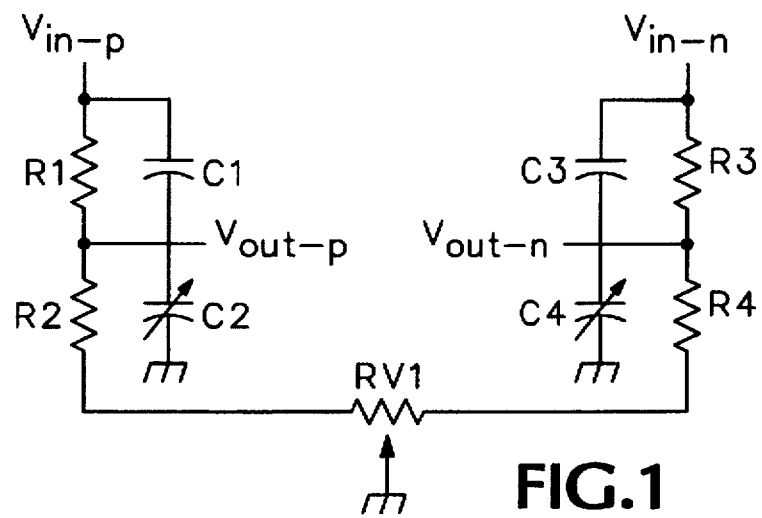
FIG. 1 shows a prior art differential attenuator with manually adjustable resistive and capacitive elements that can be adjusted to provide balanced values on the positive and negative halves of the circuit, thereby providing common mode rejection ratio compensation capability.
Figure 2:
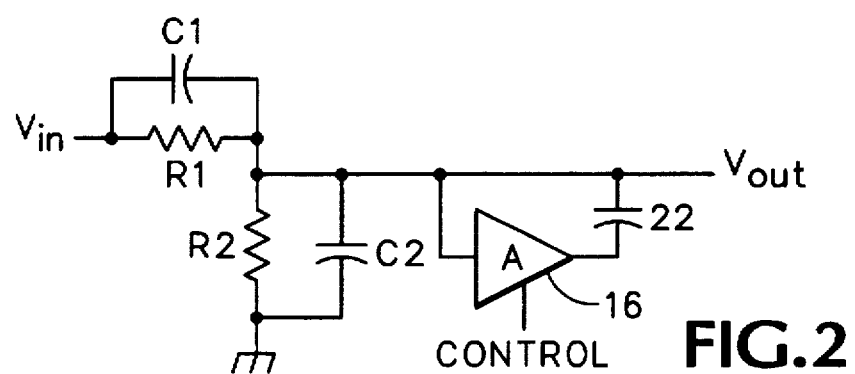
FIG. 2 shows a prior art single-ended attenuator with fixed resistors and capacitors in which the effective capacitance can be adjusted by a control signal.

U.S. Pat. No. 4,507,618 to Theodore G. Nelson for "Compensation Method and Apparatus for an RC Attenuator", hereby incorporated by reference, discloses a method for compensating a single-ended RC attenuator with fixed resistors and capacitors so that the effective capacitance appears to change. FIG. 2 in the present application shows the relevant part of this prior art circuitry. As is described in the '618 patent, the attenuation factor, ATT, is frequency independent when C1R1=C1R2, or C1=(R2/R1) C2. For fixed value resistors, achieving such a condition requires being able to adjust the value of either C1 or C2. In FIG. 2 this is achieved by changing the control signal applied to amplifier 16, thereby affecting its gain. Changing the gain of amplifier 16 changes the effective value of C2 in a manner that depends on the ratio between the values of C22 and C2. The Miller capacitance Cm depends on the value of C22 and the gain A of the multiplier 16 as follows: Cm=C22(1-A). This Miller capacitance is additive with C22.

The term "multiplier" as used herein below means some sort of amplification means that has been configured to behave as a four-quadrant multiplier. This type of multiplier can accept positive or negative signal inputs and positive or negative multiplication coefficients, and produces an output that is the four-quadrant product of the signal input and the multiplication coefficient. A multiplication coefficient of zero produces a zero output, while positive and negative multiplication coefficients produce outputs that are products of the signal input and the respective coefficient.

Figure 3:
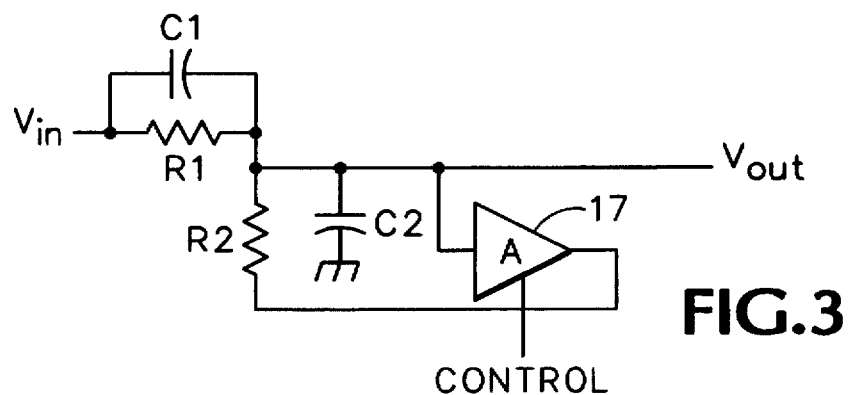
FIG. 3 shows a single-ended attenuator with fixed resistors and capacitors in which the conductance of one of the resistors can be adjusted by a control signal.

FIG. 3 shows a circuit that allows low frequency adjustment of a single ended attenuator. This circuit works by adjusting the effective Miller conductance of R2, Gm. Gm=G2(1-A), where G2 is the conductance of R2, or 1/R2, and A is the gain of multiplier 17. The resulting effective shunt resistance of the attenuator is 1/Gm. Thus, varying the control signal input of multiplier 17 causes the effective resistance of the shunt resistor R2 to vary accordingly. In the absence of a control signal value, the gain of multiplier is zero and the effective resistance is equal to the value of R2. As the control signal causes the gain of multiplier 17 to increase, the conductance is diminished and the effective resistance of R2 increases. As the control signal causes the gain of multiplier 17 to decrease, the conductance is increased and the effective resistance of R2 decreases.

Figure 4:
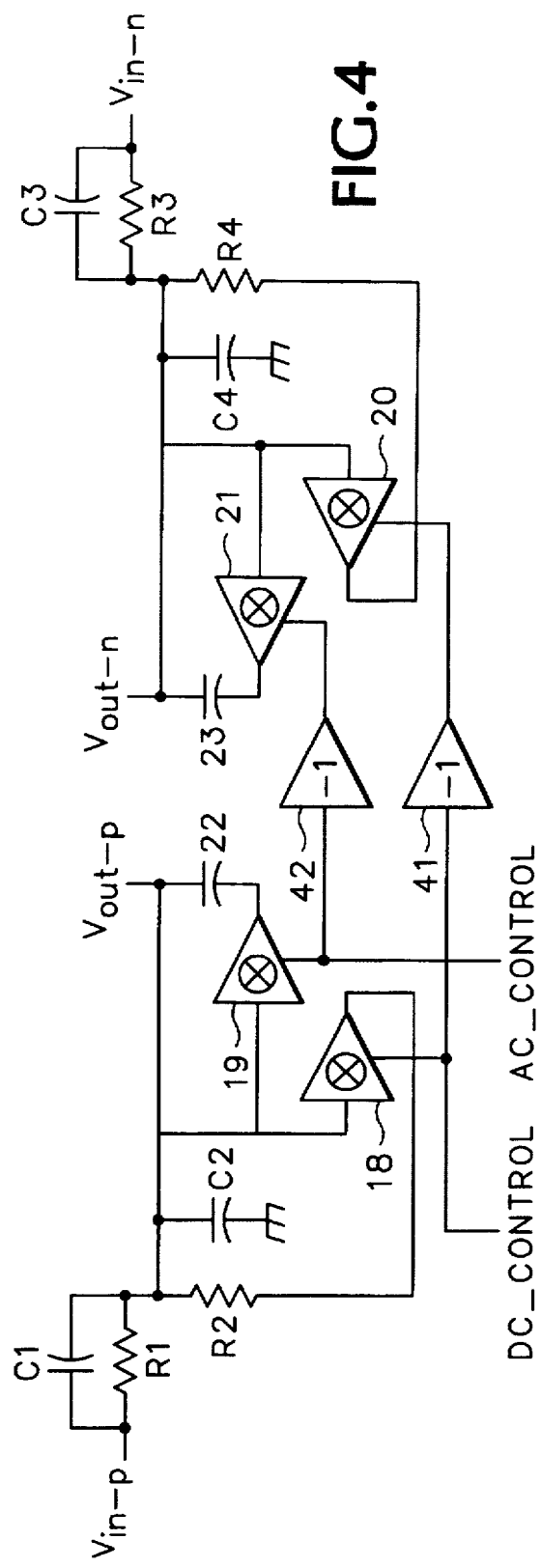
FIG. 4 shows a circuit according to the present invention that can be used to correct both low frequency and high frequency mismatches of a differential attenuator to obtain high common mode rejection.

FIG. 4 shows a circuit according to the present invention that can be used to correct both low frequency and high frequency mismatches of a differential attenuator to obtain high common mode rejection. The differential input signal consists of a positive signal, Vin-p, and a negative signal, Vin-n. Capacitor C1 and resistor R1 are connected between a positive signal input node that receives Vin-p and an output signal node at which the positive output signal, Vout-p, is produced. Similarly, on the negative side, capacitor C3 and resistor R3 are connected between a negative signal input node that receives Vin-n and an output signal node at which the negative output signal, Vout-n, is produced.

The positive output node, Vout-p, is also connected to R2, C2, C22, and the inputs of multipliers 18 and 19. The negative output node, Vout-n, is also connected to R4, C4, C23, and the inputs of multipliers 20 and 21. The output of multiplier 19 is connected to the other side of C22, while the output of multiplier 18 is connected to the other side of R2. Similarly, the output of multiplier 21 is connected to the other side of C23, while the output of multiplier 20 is connected to the other side of R4. The other sides of C2 and C4 are connected to ground. The multiplication coefficient of multiplier 18 is controlled by a DC__Control signal, while the multiplication coefficient of multiplier 20 is controlled by an inverted version of DC__Control. The multiplication coefficient of multiplier 19 is controlled by an AC__Control signal, while the multiplication coefficient of multiplier 21 is controlled by an inverted version of AC__Control.

Varying the signal AC__Control changes the multiplication coefficient of multipliers 19 and 21 in opposite directions, increasing the multiplication coefficient of one while decreasing the multiplication coefficient of the other, or vice versa. This has the effect of increasing the shunt capacitance on one side of the attenuator while decreasing the shunt capacitance on the other side. Similarly, varying the signal DC__Control changes the multiplication coefficient of multipliers 18 and 20 in opposite directions, and this has the effect of increasing the shunt resistance on one side of the attenuator while decreasing the shunt resistance on the other side. Thus, the DC__Control and AC__Control signals can be used to null mismatches between the two sides of the attenuator to provide both low frequency and high frequency common mode rejection ratio enhancement.

If the inversion multipliers 41 and 42 are removed, and separate additional DC__Control and AC__Control signals are supplied for the negative side of the attenuator, the circuit shown in FIG. 4 is modified to differential multiplication coefficient and compensation adjustments, as well as the DC and AC CMRR correction provided by the circuit as shown.

Figure 5:
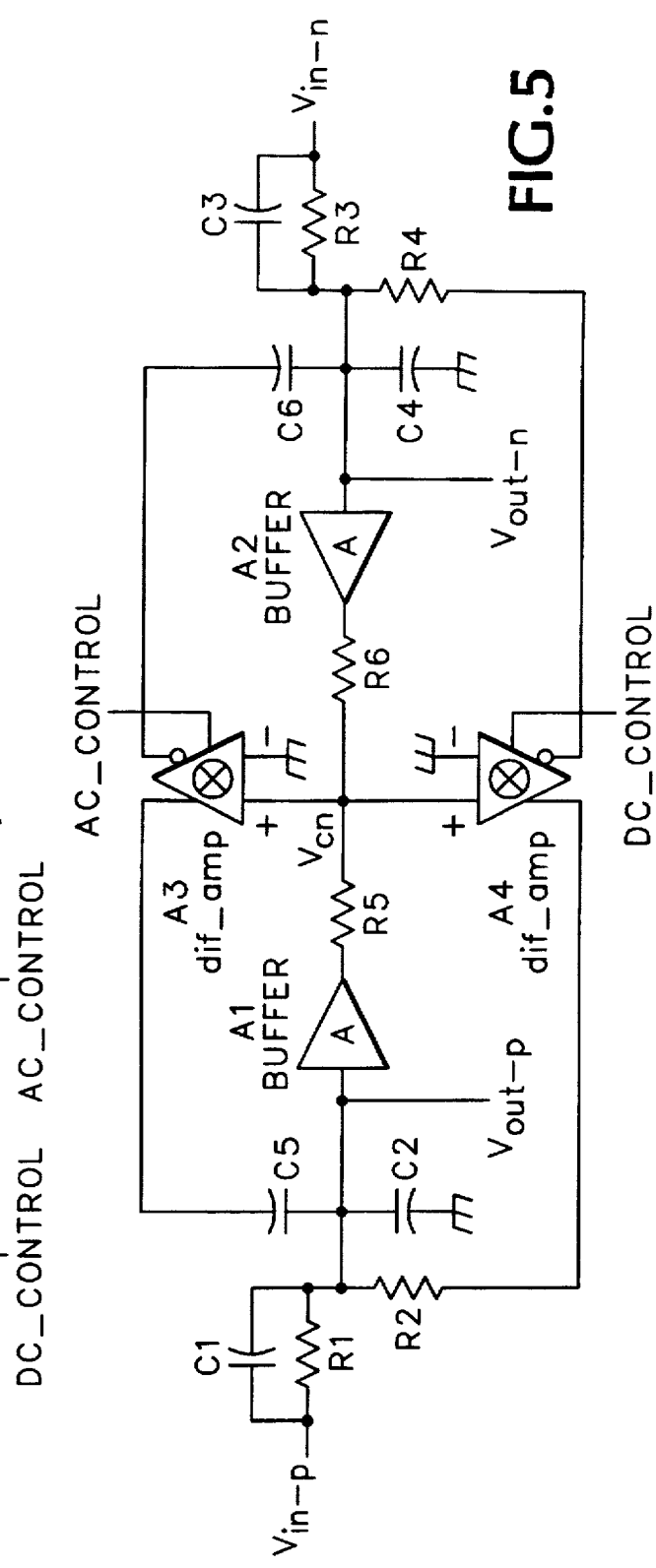
FIG. 5 shows a preferred embodiment of the invention that is simpler and yet corrects for side-to-side mismatches in the attenuator components, without that adjustment affecting the differential signal gain.

FIG. 5 shows a preferred embodiment of the invention if it is not necessary to provide differential multiplication coefficient and compensation adjustments. This version of the invention provides better performance, requires less power, and has less complexity than the version of the circuit shown in FIG. 4. It corrects for side-to-side mismatches in the attenuator components, and that adjustment does not affect the differential signal multiplication coefficient.

In FIG. 5, C1 and R1 are connected between the positive input (Vin-p) and positive output (Vout-p) nodes, while C3 and R3 are connected between the negative input (Vin-n) and negative output (Vout-n) nodes of the attenuator. C2 couples the positive output (Vout-p) node to ground and C4 couples the negative output (Vout-n) node to ground. Buffer multiplier A1 has its high impedance input connected to the positive output (Vout-p) node and supplies its output to R5, the other end of which is connected to the common mode voltage node, Vcm. Similarly, buffer amplifier A2 has its high impedance input connected to the negative output (Vout-n) node and supplies its output to R6, the other end of which is connected to the common mode voltage node, Vcm. The common mode voltage node, Vcm, is also the positive input to differential multipliers A3 and A4. The negative input to both differential multipliers A3 and A4 is ground. The positive output of differential multiplier A3 is connected to C5, and the other side of C5 is connected to the positive output (Vout-p) node. The negative output of differential multiplier A3 is connected to C6, and the other side of C6 is connected to the negative output (Vout-n) node. The positive output of differential multiplier A4 is connected to R2, and the other side of R2 is connected to the positive output (Vout-p) node. The negative output of differential multiplier A4 is connected to R4, and the other side of R4 is connected to the negative output (Vout-n) node. The multiplication coefficient of differential multiplier A3 is controlled by the signal AC__Control, while the multiplication coefficient of differential multiplier A4 is controlled by the signal DC__Control.

The basic attenuator components shown in FIG. 5, R1–R4 and C1–C6, are chosen or trimmed to provide the desired DC and AC differential attenuation. Then side-to-side imbalances can be corrected using the DC__Control and AC__Control signals. The inputs of buffer amplifiers A1 and A2 present a high impedance to the positive output (Vout-p) node and the negative output (Vout-n), respectively. Buffer amplifiers A1 and A2 present to the resistors on their outputs, R5 and R6, respectively, the voltages on their inputs. Since differential multipliers A3 and A4 have high impedance inputs, when the inputs Vin-p and Vin-n are driven differentially, the voltage at node Vcm is the average of those signals, i.e., the common mode voltage. If a flat frequency response is desired, parallel capacitors can be placed around resistors R5 and R6 to so provide. Also, an additional resistor can be added connecting Vcm to ground to reduce the common-mode signal and the dynamic range needed from multipliers A3 and A4.

As in the previous version of the invention shown in FIG. 4, the version shown in FIG. 5 allows one control signal, either AC__Control or DC__Control, to change the effective capacitance or resistance of both halves of the attenuator circuit in opposite directions at the same time. For example, increasing the multiplication coefficient of differential multiplier A3 via the AC_Control signal decreases the effective shunt capacitance on the positive side of the attenuator circuit while at the same time increasing the effective shunt capacitance on the negative side. Similarly, decreasing the multiplication coefficient of differential multiplier A4 via the DC_Control signal decreases the effective shunt resistance on the positive side of the attenuator while at the same time increasing the effective shunt resistance on the negative side. Through the use of these controls a wide range of side-to-side component variations can be compensated to maximize the common mode rejection ratio achievable.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A differential attenuator comprising:

a positive input node;

a negative input node;

a positive output node;

a negative output node;

a positive side series resistor coupled between the positive input node and the positive output node;

a positive side series capacitor coupled in parallel with the positive side series resistor;

a negative side series resistor coupled between the negative input node and the negative output node;

a negative side series capacitor coupled in parallel with the negative side series resistor;

positive side shunt resistance means, the positive side shunt resistance means including a positive side shunt resistor coupled to the positive output node, and further including multiplier means, the multiplier means having an input coupled to the positive output node and an output coupled to another end of the positive side shunt resistor, and the multiplier means also having a multiplication coefficient control input coupled to receive a dc_control signal;

negative side shunt impedance means, the negative side shunt resistance means including a negative side shunt resistor coupled to the negative output node, and further including multiplier means, the multiplier means having an input coupled to the negative output node and an output coupled to another end of the negative side shunt resistor, and the multiplier means also having a multiplication coefficient control input coupled to receive a dc_control signal;

positive side shunt capacitance means, the positive side shunt capacitance means including a positive side shunt capacitor coupled to the positive output node, and further comprising multiplier means, the multiplier means having an input coupled to the positive output node and an output capacitively coupled to the positive output node, and the multiplier means also having a multiplication coefficient control input coupled to receive an ac_control signal; and negative side shunt capacitance means, the negative side shunt capacitance means including a negative side shunt capacitor coupled to the negative output node, and further comprising multiplier means, the multiplier means having an input coupled to the negative output node and an output capacitively coupled to the positive output node, and the multiplier means also having a multiplication coefficient control input coupled to receive an ac_control signal.

2. A differential attenuator according to claim 1 wherein dc_control signal is coupled to the multiplication coefficient control of one of the amplifier means by an inverting multiplier.

3. A differential attenuator according to claim 1 wherein ac_control signal is coupled to the multiplication coefficient control of one of the amplifier means by an inverting multiplier.

* * * * *